US012159903B2

(12) United States Patent
Ha

(10) Patent No.: US 12,159,903 B2
(45) Date of Patent: Dec. 3, 2024

(54) POWER SEMICONDUCTOR DEVICE AND METHOD OF FABRICATING THE SAME

(71) Applicant: HYUNDAI MOBIS CO., LTD., Seoul (KR)

(72) Inventor: Jeong Mok Ha, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 17/466,224

(22) Filed: Sep. 3, 2021

(65) Prior Publication Data

US 2022/0069084 A1   Mar. 3, 2022

(30) Foreign Application Priority Data

Sep. 3, 2020   (KR) .................. 10-2020-0112141
Sep. 3, 2020   (KR) .................. 10-2020-0112142

(51) Int. Cl.
*H01L 29/10*   (2006.01)
*H01L 29/66*   (2006.01)
(Continued)

(52) U.S. Cl.
CPC .... *H01L 29/1045* (2013.01); *H01L 29/66068* (2013.01); *H01L 29/7813* (2013.01); *H01L 29/1608* (2013.01)

(58) Field of Classification Search
CPC .......... H01L 29/7846; H01L 29/66553; H01L 29/785; H01L 2029/7858;
(Continued)

(56) References Cited

U.S. PATENT DOCUMENTS 9,947,750 B2    4/2018  Gotoh
2009/0032821 A1*  2/2009  Onose .............. H01L 29/66068
                                              257/77
(Continued)

FOREIGN PATENT DOCUMENTS

CN     105990434 A    10/2016
JP     2000-188397 A   7/2000
(Continued)

OTHER PUBLICATIONS

Korean Office Action issued on Oct. 28, 2021 in corresponding Korean Patent Application No. 10-2020-0112142 (6 pages in Korean).
(Continued)

*Primary Examiner* — Cuong B Nguyen
(74) *Attorney, Agent, or Firm* — NSIP Law

(57) ABSTRACT

A power semiconductor device includes: a semiconductor layer of silicon carbide (SiC); at least one trench recessed into the semiconductor layer from a surface of the semiconductor layer; a gate insulating layer disposed on an inner surface of the at least one trench; at least one gate electrode layer disposed on the gate insulating layer to bury the at least one trench; a drift region disposed in the semiconductor layer under the at least one gate electrode layer, including a protrusion in contact with a part of a bottom surface of the at least one trench, and having a first conductivity type; a well region disposed in the semiconductor layer to contact the drift region while surrounding side surfaces and bottom edges of the at least one trench, and having a second conductivity type; and a source region disposed in the well region and having the first conductivity type.

14 Claims, 14 Drawing Sheets

(51) Int. Cl.
*H01L 29/78* (2006.01)
*H01L 29/16* (2006.01)

(58) Field of Classification Search
CPC ..... H01L 21/823475; H01L 21/823487; H01L 27/088; H01L 21/28518; H01L 21/823871; H01L 21/823885; H01L 23/485; H01L 27/092; H01L 29/41741; H01L 29/7827; H01L 29/66666; H01L 29/0696; H01L 29/1095; H01L 29/7375; H01L 29/7393–7395; H01L 29/7397; H01L 29/66325; H01L 29/66333–66348; H01L 29/66712–66734; H01L 29/7802–7815; H01L 29/4236; H01L 29/42352; H01L 29/66613–66628; H01L 29/1045; H01L 29/66068; H01L 29/7813; H01L 29/1608; H01L 29/0865; H01L 29/0869; H01L 29/7828; H01L 29/42376; H01L 21/049; H01L 29/0607; H01L 29/0684; H01L 29/1037; H10B 10/12
See application file for complete search history.

(56) References Cited

U.S. PATENT DOCUMENTS

2015/0318389 A1  11/2015  Tsuchiya et al.
2017/0125559 A1* 5/2017  Tsukanov ............ H01L 29/0634

FOREIGN PATENT DOCUMENTS

| | | |
|---|---|---|
| JP | 2004-241768 A | 8/2004 |
| JP | 2015-026723 A | 2/2015 |
| JP | 2002-176177 A | 6/2022 |
| KR | 10-0199997 B1 | 7/1999 |
| KR | 10-2006-0040592 A | 5/2006 |
| KR | 10-2008-0021569 A | 3/2008 |
| KR | 10-2009-0022685 A | 3/2009 |
| KR | 10-2009-0087833 A | 8/2009 |
| KR | 10-2011-0049249 A | 5/2011 |

OTHER PUBLICATIONS

Korean Office Action issued on Oct. 28, 2021 in corresponding Korean Patent Application No. 10-2020-0112141 (6 pages in Korean).
Song, Qingwen, et al. "4H—SiC Trench MOSFET with L-shaped Gate." IEEE Electron Device Letters 37.4 (Apr. 2016): 463-466.
German Office Action issue on May 11, 2022, in counterpart German Patent Application No. 10 2021 122 629.5 (9 pages in English and 9 pages in German).
Tan, Jian, et al., "High-Voltage Accumulation-Layer UMOSFET's in 4H—SiC." IEEE Electron Device Letters 19.12 (1998): 487-489.
German Office Action issued on Oct. 10, 2023, in counterpart German Patent Application No. 10 2021 122 629.5 (9 pages in English, 8 pages in German).
Chinese Office Action issued on Sep. 30, 2024, in counterpart Chinese Patent Application No. 202111027439.X (8 pages in English, 8 pages in Chinese).

* cited by examiner

POWER SEMICONDUCTOR DEVICE AND METHOD OF FABRICATING THE SAME

CROSS-REFERENCE TO RELATED APPLICATIONS

This application claims the benefit under 35 U.S.C. § 119(a) of Korean Patent Application Nos. 10-2020-0112141 and 10-2020-0112142, both filed on Sep. 3, 2020 in the Korean Intellectual Property Office, the entire disclosures of which are incorporated herein by reference for all purposes.

BACKGROUND

1. Field

The following description relates to a semiconductor device. For example, the following disclosure relates to a power semiconductor device for switching a power transfer and a method of fabricating such a power semiconductor device.

2. Description of Related Art

A power semiconductor device is, for example, a semiconductor device that operates in a high-voltage and high-current environment. The power semiconductor device may be used in a field requiring a high-power switching operation, for example, in power conversion, a power converter, an inverter, or the like. For example, the power semiconductor device may include an insulated gate bipolar transistor (IGBT), a metal oxide semiconductor field effect transistor (MOSFET), or the like. The power semiconductor device generally calls for a high withstand voltage characteristic. Currently, the power semiconductor device may additionally call for a high-speed switching operation.

As such, a power semiconductor device may use silicon carbide (SiC) instead of silicon (Si). Silicon carbide (SiC) is a wide gap semiconductor material having a bandgap higher than that of silicon, and may maintain stability even at a high temperature, compared to silicon. In addition, because a breakdown electric field of silicon carbide is higher than that of silicon, silicon carbide may stably operate even at a high temperature. Accordingly, silicon carbide makes operation possible at a high temperature through a high breakdown voltage compared to silicon and excellent heat release.

To increase a channel density of a power semiconductor device using silicon carbide, a trench type of gate structure having a vertical channel structure may be used. In the trench-type gate structure, because an electric field is concentrated on a trench edge, various structures are applied thereto for the purpose of protecting a lower part of a trench, but there is a limitation in alleviating the electric field in the vertical channel structure.

In addition, as illustrated in FIG. 14, because silicon carbide grows at each terrace due to a bonding structure thereof in epitaxial growth, the direct growth on a (0001) plane is difficult. For this reason, the silicon carbide grows in a state of being tilted at an angle of about 4 degrees. In this case, even though a trench is vertically formed, because orientations (i.e., crystallographic directions) of side walls of the trench are different, a distribution of mobility becomes great in a channel region formed along the side walls of the trench.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes: a semiconductor layer of silicon carbide (SiC); at least one trench recessed into the semiconductor layer from a surface of the semiconductor layer; a gate insulating layer disposed on an inner surface of the at least one trench; at least one gate electrode layer disposed on the gate insulating layer so as to bury the at least one trench; a drift region disposed in the semiconductor layer under the at least one gate electrode layer, including a protrusion in contact with a part of a bottom surface of the at least one trench, and having a first conductivity type; a well region disposed in the semiconductor layer such that the well region is in contact with the drift region while surrounding side surfaces and bottom edges of the at least one trench, and having a second conductivity type; and a source region disposed in the well region and having the first conductivity type.

The well region may be disposed in the semiconductor layer to be deeper than the at least one trench while exposing a central part of the bottom surface of the at least one trench and surrounding the bottom edges. The protrusion may be disposed in contact with the gate insulating layer and the well region at the central part of the bottom surface of the at least one trench.

The power semiconductor device may further include: a channel region disposed in the well region such that the channel region is adjacent to the at least one gate electrode layer continuously from the protrusion to the source region.

The channel region may include: a horizontal part disposed parallel to the well region under a bottom surface of the at least one gate electrode layer; and a vertical part disposed perpendicular to the well region on one side surface of the at least one gate electrode layer.

The at least one trench may extend in one direction in a line type structure. The at least one trench may include side surfaces that are opposite to each other with respect to the one direction, and bottom edges that are opposite to each other with respect to the one direction. The well region may extend under the bottom surface of the at least one trench so as to cover the side surfaces of the at least one trench and to cover the bottom edges of the at least one trench.

The at least one trench may include a plurality of trenches extending in one direction in a line type structure and arranged in parallel with each other. The gate insulating layer may be disposed at least on inner surfaces of the plurality of trenches. The at least one gate electrode layer may include a plurality of gate electrode layers disposed on the gate insulating layer so as to bury the plurality of trenches, respectively.

The well region may be disposed in the semiconductor layer between the plurality of trenches so as to cover opposite side surfaces of each of the plurality of trenches, and may extend under bottom surfaces of the plurality of trenches so as to cover opposite bottom edges of each of the plurality of trenches.

The power semiconductor device may further include: a drain region in the semiconductor layer under the drift region, the drain region having the first conductivity type. A doping concentration of the drain region may be higher than a doping concentration of the drift region.

The drain region may be formed of a substrate of silicon carbide having the first conductivity type. The drift region may be formed of an epitaxial layer on the drift region.

The power semiconductor device may further include a channel region disposed in the semiconductor layer between the source region and the protrusion. The source region may extend to between the well region and the side surfaces of the at least one trench from the surface of the semiconductor layer.

The well region may be disposed in the semiconductor layer to be deeper than the at least one trench while exposing a central part of the bottom surface of the at least one trench and surrounding the bottom edges.

The source region may be formed to extend along the side surfaces of the at least one trench from the surface of the semiconductor layer and to cover the bottom edges of the at least one trench. The channel region may be disposed under the bottom surface of the at least one trench.

The source region may be disposed in contact with the protrusion under the bottom surface of the at least one trench. The channel region may have the first conductivity type such that an accumulation channel is formed, and may be a part of the drift region.

The well region may cover an end part of the source region under the bottom surface of the at least one trench. The channel region may have the second conductivity type such that an inversion channel is formed, and may be a part of the well region.

In another general aspect, a method of fabricating a power semiconductor device includes: forming a drift region in a semiconductor layer of silicon carbide (SiC), wherein the drift region includes a protrusion and has a first conductivity type; forming a well region in the semiconductor layer on the drift region, wherein the well region has a second conductivity type; forming a source region in the semiconductor layer on the well region, wherein the source region has the first conductivity type; forming at least one trench recessed into the semiconductor layer, wherein the at least one trench penetrates a part of the source region from a surface of the semiconductor layer and is in contact with the protrusion; forming a gate insulating layer at least on an inner surface of the at least one trench; and forming at least one gate electrode layer on the gate insulating layer so as to bury the at least one trench. The protrusion is in contact with a bottom surface of the at least one trench. The well region is formed in the semiconductor layer, and is in contact with the drift region while surrounding side surfaces and bottom edges of the at least one trench.

The method may further include: forming a channel region in the well region to be adjacent to the at least one gate electrode layer continuously from the protrusion of the drift region to the source region.

Other features and aspects will be apparent from the following detailed description, the drawings, and the claims.

Figure 1:
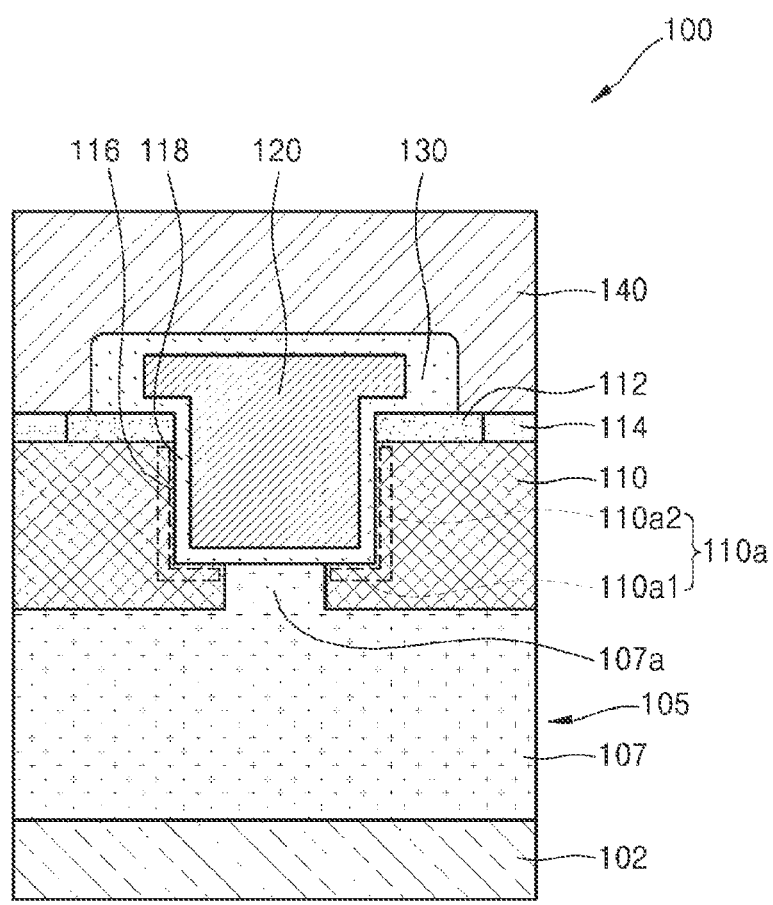
FIG. 1 is a schematic cross-sectional view illustrating a power semiconductor device, according to an embodiment.

Throughout the drawings and the detailed description, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is to be noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view illustrating a power semiconductor device 100, according to an embodiment.

Referring to FIG. 1, the power semiconductor device 100 may at least include a semiconductor layer 105, a gate insulating layer 118, and a gate electrode layer 120. For example, the power semiconductor device 100 may have a power MOSFET structure.

The semiconductor layer 105 may include one semiconductor material layer or a plurality of semiconductor material layers. For example, the semiconductor layer 105 may include one epitaxial layer or a plurality of epitaxial layers. In addition, the semiconductor layer 105 may include one or multiple epitaxial layers on a semiconductor substrate.

For example, the semiconductor layer 105 may be formed of silicon carbide (SiC). For example, the semiconductor layer 105 may include at least one epitaxial layer of silicon carbide (SiC).

Silicon carbide (SiC) may have a wider bandbap than silicon, thus maintaining stability even at a high temperature compared to silicon. In addition, because a breakdown electric field of silicon carbide is much higher than that of silicon, silicon carbide may stably operate even at a high temperature. Accordingly, the power semiconductor device 100 in which silicon carbide is used as the semiconductor layer 105 may have a high breakdown voltage compared to a power semiconductor device including silicon, and may provide an excellent heat release characteristic and a stable operating characteristic at a high temperature.

For example, the semiconductor layer 105 may include a drift region 107. The drift region 107 may have a first conductivity type and may be formed by implanting impurities of the first conductivity type into a part of the semiconductor layer 105. For example, the drift region 107 may be formed by doping impurities of the first conductivity type in an epitaxial layer of silicon carbide. In addition, the drift region 107 may include a protrusion 107a, a part of which extends upwardly.

A well region 110 may be formed in the semiconductor layer 105 to be in contact with the drift region 107 and may have a second conductivity type. For example, the well region 110 may be formed by doping impurities of the second conductivity type opposite to the first conductivity type in the semiconductor layer 105.

For example, the well region 110 may be formed to be in contact with the drift region 107 while surrounding at least a part of the drift region 107. For example, the well region 110 may surround a side surface of the protrusion 107a of the drift region 107 and may be formed on the remaining part of the drift region 107. In an operation of the power semiconductor device 100, the protrusion 107a may provide a vertical movement path of charges.

The well region 110 is illustrated in FIG. 1 as including two well regions spaced apart from each other such that the protrusion 107a is interposed therebetween, but the well region 110 may be changed or modified in various ways. For example, the protrusion 107a may have a shape whose side surface is surrounded by the well region 110 once.

A source region 112 may be formed on the well region 110 or in the well region 110 and may have the first conductivity type. For example, the source region 112 may be formed by doping impurities of the first conductivity type in the well region 110. The concentration of the first conductivity-type impurities doped in the source region 112 may be higher than that doped in the drift region 107.

In addition, a drain region 102 may be formed in the semiconductor layer 105 under the drift region 107 and may have the first conductivity type. For example, the drain region 102 may be doped with impurities of a high concentration compared to the drift region 107.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105.

At least one trench 116 may be formed to be recessed into the semiconductor layer 105 from a surface of the semiconductor layer 105 as much as a given depth. For example, the trench 116 may be formed by etching a part of the well region 110 from the surface of the semiconductor layer 105 so as to be in contact with the protrusion 107a of the drift region 107. As such, the protrusion 107a of the drift region 107 may be in contact with a part of a bottom surface 116a (refer to FIG. 3) of the trench 116.

In addition, the well region 110 may have a curved shape in which an edge of the well region 110 is formed at a part of the well region 110 in contact with the trench 116, and the trench 116 may be seated on the curved part of the well region 110. As such, the well region 110 may be formed to be in contact with the drift region 107 while surrounding side surfaces 116b (refer to FIG. 3) and bottom edges 116c (refer to FIG. 3) of the trench 116.

In some embodiments, the number of trenches 116 may be appropriately selected depending on the performance of the power semiconductor device 100. For example, one trench 116 or a plurality of trenches 116 may be provided depending on the performance of the power semiconductor device 100. In embodiments including a plurality of trenches 116, the plurality of trenches 116 may be variously arranged in a line type structure or a matrix structure.

The gate insulating layer 118 may be formed at least on an inner surface of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to bury at least the trench 116. For example, the gate electrode layer 120 may include an appropriate conductive material such as polysilicon, metal, metal nitride, or metal silicide, or may include a stacked structure thereof.

In some embodiments, the gate electrode layer 120 may be formed to bury the inside of the trench 116 and to further protrude in an upward direction of the semiconductor layer 105. In addition, the protruding part of the gate electrode layer 120 may further extend onto the well region 110 or the source region 112. As such, the cross-sectional area of the protruding part of the gate electrode layer 120 may be larger than the cross-sectional area of the part of the gate electrode layer 120 that is buried in the trench 116.

In some embodiments, the well region 110 may be formed in the semiconductor layer 105 to be deeper than the trench 116 while exposing at least a central part of the bottom surface 116a of the trench 116 and surrounding the bottom edges 116c. The protrusion 107a of the drift region 107 may be formed to be in contact with the gate insulating layer 118 and the well region 110 at the central part of the bottom surface 116a of the trench 116, which is exposed by the well region 110.

A channel region 110a may be formed in the well region 110 to be adjacent to the gate electrode layer 120 continuously from the protrusion 107a of the drift region 107 to the source region 112. For example, the channel region 110a may have the second conductivity type, and an inversion channel may be formed in the channel region 110a in an operation of the power semiconductor device 100.

Because the channel region 110a has a doping type opposite to that of the source region 112 and the drift region 107, the channel region 110a may form a diode junction with the source region 112 and the drift region 107. Accordingly, the channel region 110a may not permit charges to move in a normal situation (e.g., when no voltage or a voltage other than an operating voltage is applied to the gate electrode layer 120); however, when the operating voltage is applied to the gate electrode layer 120, an inversion channel may be formed in the channel region 110a such that the movement of charges is permitted.

In some embodiments, the channel region 110a may be a part of the well region 110. In this case, the channel region 110a may be integrally formed to be continuously connected with the well region 110. A doping concentration of the second conductivity-type impurities of the channel region 110a may be the same as that of the remaining part of the well region 110 or may be different therefrom for the adjustment of a threshold voltage.

In more detail, the channel region 110a may include a horizontal part 110a1 formed to be parallel to the well region 110 under a bottom surface of the gate electrode layer 120 or the bottom surface 116a of the trench 116, and a vertical part 110a2 formed to be perpendicular to the well region 110 on one side surface of the gate electrode layer 120 or one side surface 116b (refer to FIG. 3) of the trench 116. One end of the horizontal part 110a1 of the channel region 110a may be in contact with the protrusion 107a of the drift region 107, and one end of the vertical part 110a2 of the channel region 110a may be in contact with the source region 112. As such, the channel region 110a may have a structure in which a horizontal structure and a vertical structure are combined, rather than a simple vertical structure.

A well contact region 114 may be formed in the source region 112 or on the well region 110. For example, the well contact region 114 may extend from the well region 110 to penetrate the source region 112 and may have the second conductivity type. One well contact region 114 or a plurality of well contact regions 114 may be formed in the source region 112. To reduce a contact resistance, the well contact region 114 may be doped with second conductivity-type impurities of a higher concentration than the well region 110.

An interlayer insulating layer 130 may be formed on the gate electrode layer 120. For example, the interlayer insulating layer 130 may include an appropriate insulating material such as oxide or nitride, or may include a stacked structure thereof.

A source electrode layer 140 may be formed on the interlayer insulating layer 130 and may be connected with the source region 112 and the well contact region 114. For example, the source electrode layer 140 may be formed of an appropriate conductive material, such as metal, or the like.

In the power semiconductor device 100 described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

For example, when the power semiconductor device 100 is an N-type MOSFET, the drift region 107 may be an N− region, the source region 112 and the drain region 102 may be N+ regions, the well region 110 and the channel region 110a may be P− regions, and the well contact region 114 may be a P+ region.

In an operation of the power semiconductor device 100, a current may generally flow in a vertical direction along the protrusion 107a of the drift region 107 from the drain region 102, may then flow in a horizontal direction along the bottom surface of the gate electrode layer 120 through the channel region 110a, and may then flow in a vertical direction along the side surface of the gate electrode layer 120, that is, to the source region 112.

In the power semiconductor device 100, the well region 110 may surround all the bottom edges of the gate electrode layer 120 or all the bottom edges 116c of the trench 116. As such, the concentration of an electric field on the bottom edges of the gate electrode layer 120 or the bottom edges 116c of the trench 116 may be further alleviated. As such, a margin of an electric field across the gate insulating layer 118 of the power semiconductor device 100 may increase, and thus, the reliability of operation of the power semiconductor device 100 may be improved. In addition, it is possible to reduce a junction resistance of the protrusion 107a of the drift region 107 by decreasing an electric field of the bottom surface of the trench 116 and decreasing an electric field across the gate insulating layer 118.

FIGS. 2 to 5 are cross-sectional views illustrating a method of fabricating the power semiconductor device 100 of FIG. 1, according to one or more embodiments.

Figure 2:
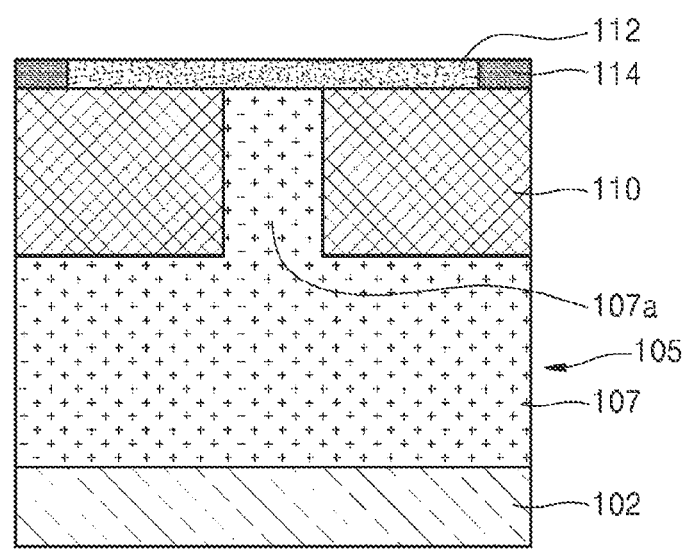
FIGS. 2 to 5 are cross-sectional views illustrating a method of fabricating the power semiconductor device of FIG. 1, according to one or more embodiments.

Referring to FIG. 2, the drift region 107 that includes the protrusion 107a and has the first conductivity type may be formed in the semiconductor layer 105 of silicon carbide (SiC). For example, the drift region 107 may be formed on the drain region 102 having the first conductivity type. In some embodiments, the drain region 102 may be implemented with a substrate of silicon carbide (SiC) having the first conductivity type, and the drift region 107 may be formed on the substrate by using one or more epitaxial layers.

Next, the well region 110 having the second conductivity type may be formed in the semiconductor layer 105 to be in contact with the drift region 107. For example, the forming of the well region 110 may include implanting impurities of the second conductivity type into the semiconductor layer 105.

For example, the well region 110 may be formed in the semiconductor layer 105 to surround the protrusion 107a of the drift region 107. In some embodiments, the drift region 107 may be formed on the drain region 102 by using at least one layer, and the well region 110 may be formed by doping impurities, a conductivity type of which are opposite to that of the drift region 107, in the drift region 107. In this case, the well region 110 may be formed in the drift region 107 such that the protrusion 107a is defined.

In some embodiments, unlike the example of FIG. 2, the well region 110 may be formed continuously on the protrusion 107a of the drift region 107.

Then, the source region 112 having the first conductivity type may be formed in the well region 110 or on the well region 110. For example, the forming of the source region 112 may include implanting impurities of the first conductivity type into the semiconductor layer 105 on the well region 110 or into the well region 110.

In addition, the well contact region 114 may be formed on the well region 110. For example, the well contact region 114 may be formed by implanting the second conductivity-type impurities of a higher concentration than the well region 110 into a part of the semiconductor layer 105 on the well region 110 or into a part of the well region 110.

In addition, the channel region 110a may be formed in the semiconductor layer 105 between the source region 112 and the protrusion 107a of the drift region 107. For example, the channel region 110a may be a part of the well region 110 and may be formed by implanting impurities of the second conductivity type into the semiconductor layer 105.

In steps described above, the impurity implantation or the impurity doping may be performed by implanting the impurities into the semiconductor layer 105 or implanting the impurities such that the impurities are mixed when an epitaxial layer is formed. However, an ion implantation method using a mask pattern may be used for implantation of the impurities in a selective region.

Optionally, a heat treatment process for activating or diffusing the impurities may be performed after the ion implantation.

Figure 3:
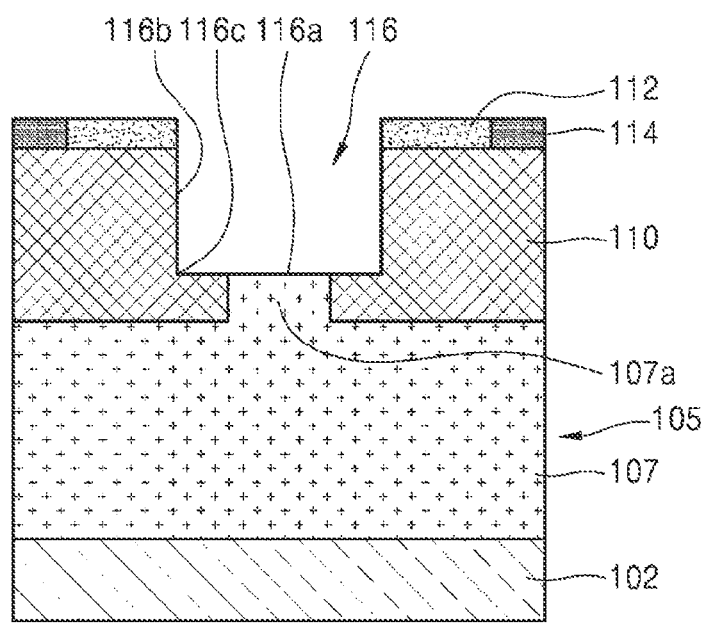

Referring to FIG. 3, at least one trench 116 may be formed to be recessed into the semiconductor layer 105 from a surface of the semiconductor layer 105 as much as a given depth.

For example, the trench 116 may be formed by partially etching a part of the protrusion 107a of the drift region 107 and a part of the well region 110. As such, the source region 112 may be disposed adjacent to the trench 116. In addition, the bottom surface 116a of the trench 116 may be formed to be in contact with the protrusion 107a of the drift region 107. Accordingly, the trench 116 may be formed to be thinner than an average depth of the well region 110.

For example, the well region 110 have a curved shape in which an edge of the well region 110 is dug at a part thereof being in contact with the trench 116, and the trench 116 may be seated on the curved part of the well region 110. As such, the well region 110 may be in contact with the drift region 107 while surrounding the side surfaces 116b and the bottom edges 116c of the trench 116, and the protrusion 107a of the drift region 107 may be in contact with a part of the bottom surface 116a of the trench 116. In addition, the source region 112 may be in contact with upper ends of the side surfaces 116b of the trench 116.

In some embodiments, in the case where the well region 110 is disposed continuously on the protrusion 107a of the drift region 107, the trench 116 may be formed by partially etching a part of the well region 110 so as to penetrate a part of the source region 112.

Through the above structure of the trench 116, the channel region 110a may include the horizontal part 110a1 formed to be parallel to the well region 110 under the bottom surface 116a of the trench 116, and the vertical part 110a2 formed to be perpendicular to the well region 110 on one side surface 116b of the trench 116.

For example, the trench 116 may be formed by forming a photo mask by using photo lithography, and then etching the semiconductor layer 105 by using the photo mask as an etching protection layer.

Figure 4:
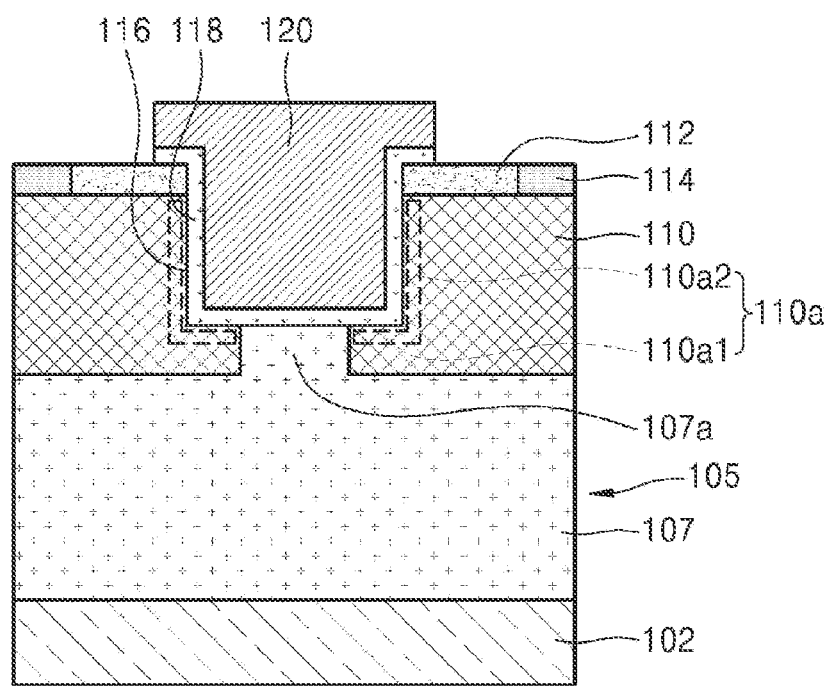

Referring to FIG. 4, the gate insulating layer 118 may be formed at least on an inner surface of the trench 116. For example, the gate insulating layer 118 may be formed by oxidizing the semiconductor layer 105 to form an oxide or by depositing an insulating material such as oxide or nitride on the semiconductor layer 105.

Afterwards, the gate electrode layer 120 may be formed on the gate insulating layer 118 so as to bury the trench 116. For example, the gate electrode layer 120 may be formed by forming a conductive layer on the gate insulating layer 118 and patterning the conductive layer. The gate electrode layer 120 may be formed by doping impurities in polysilicon or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

Figure 5:
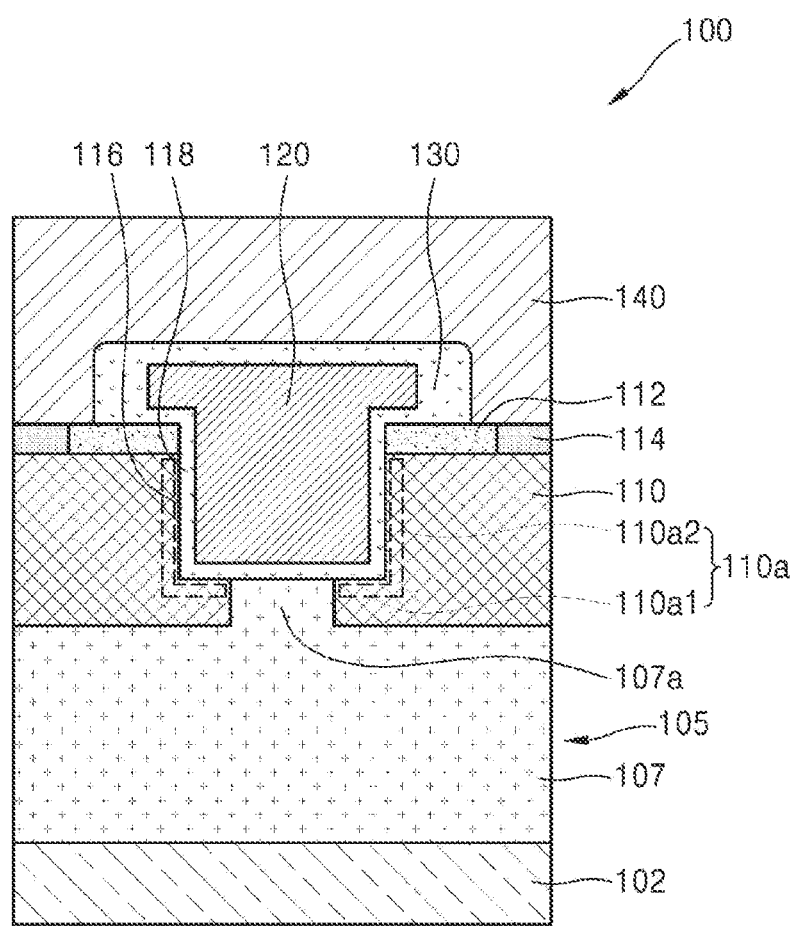

Referring to FIG. 5, the interlayer insulating layer 130 may be formed on the gate electrode layer 120. For example, the interlayer insulating layer 130 may be formed by forming at least one insulating layer, for example, an oxide layer on the structure in which the gate electrode layer 120 is formed, and patterning the insulating layer.

Next, the source electrode layer 140 may be formed on the interlayer insulating layer 130 so as to be connected with the source region 112 and the well contact region 114. For example, the source electrode layer 140 may be formed by forming a conductive layer, for example, a metal layer, on the interlayer insulating layer 130 and patterning the conductive layer.

According to the above fabricating method, the power semiconductor device 100 including the semiconductor layer 105 of silicon carbide may be economically fabricated by using processes that are applied to a conventional silicon substrate.

Figure 6:
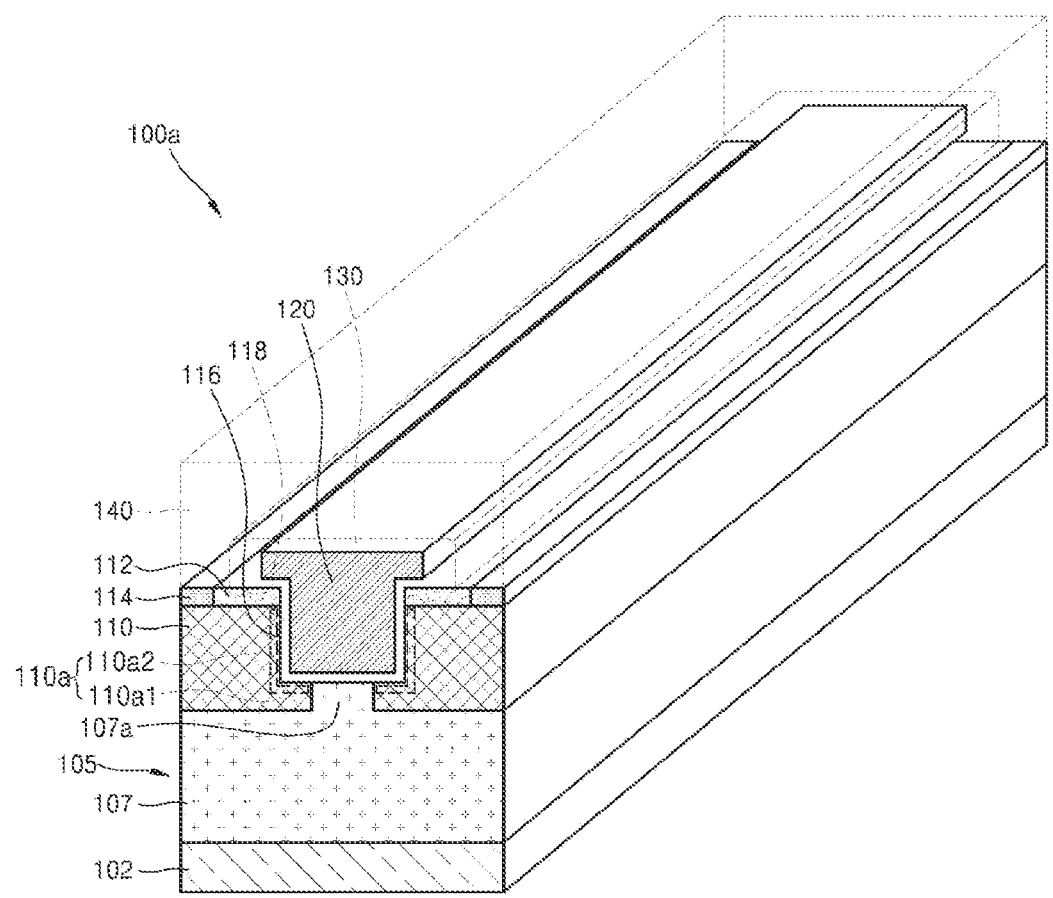
FIG. 6 is a schematic perspective view illustrating a power semiconductor device, according to an embodiment.

FIG. 6 is a schematic perspective view illustrating a power semiconductor device 100a, according to an embodiment. The power semiconductor device 100a may be implemented by using or partially modifying the power semiconductor device 100 of FIG. 1, and thus, overlapping description will be omitted to avoid redundancy.

Referring to FIG. 6, in the power semiconductor device 100a, the trench 116 may be formed to extend in one direction in a line type structure. As such, the trench 116 may include the side surfaces 116b (refer to FIG. 3), which are opposite to each other with respect to one direction, and the bottom edges 116c (refer to FIG. 3), which are opposite to each other with respect to the one direction.

The well region 110 may extend under a bottom surface 116a (refer to FIG. 3) of the trench 116 so as to cover the opposite side surfaces 116b of the trench 116 and cover the opposite bottom edges 116c thereof.

Since the trench 116 is formed in the line type structure, the gate electrode layer 120 may also be formed in the line type structure so as to extend in the one direction. Accordingly, opposite bottom edges of the gate electrode layer 120 may also be covered by the well region 110.

As a non-limiting example, a method of fabricating of the power semiconductor device 100a may correspond to the method of fabricating the power semiconductor device 100 described with reference to FIGS. 2 to 5, for example.

According to the power semiconductor device 100a, like the power semiconductor device 100, the concentration of an electric field on the bottom edges of the gate electrode layer 120 or the bottom edges 116c of the trench 116 may be further alleviated. As such, a margin of an electric field across the gate insulating layer 118 of the power semiconductor device 100a may increase, and thus, the reliability of operation of the power semiconductor device 100a may be improved.

Figure 7:
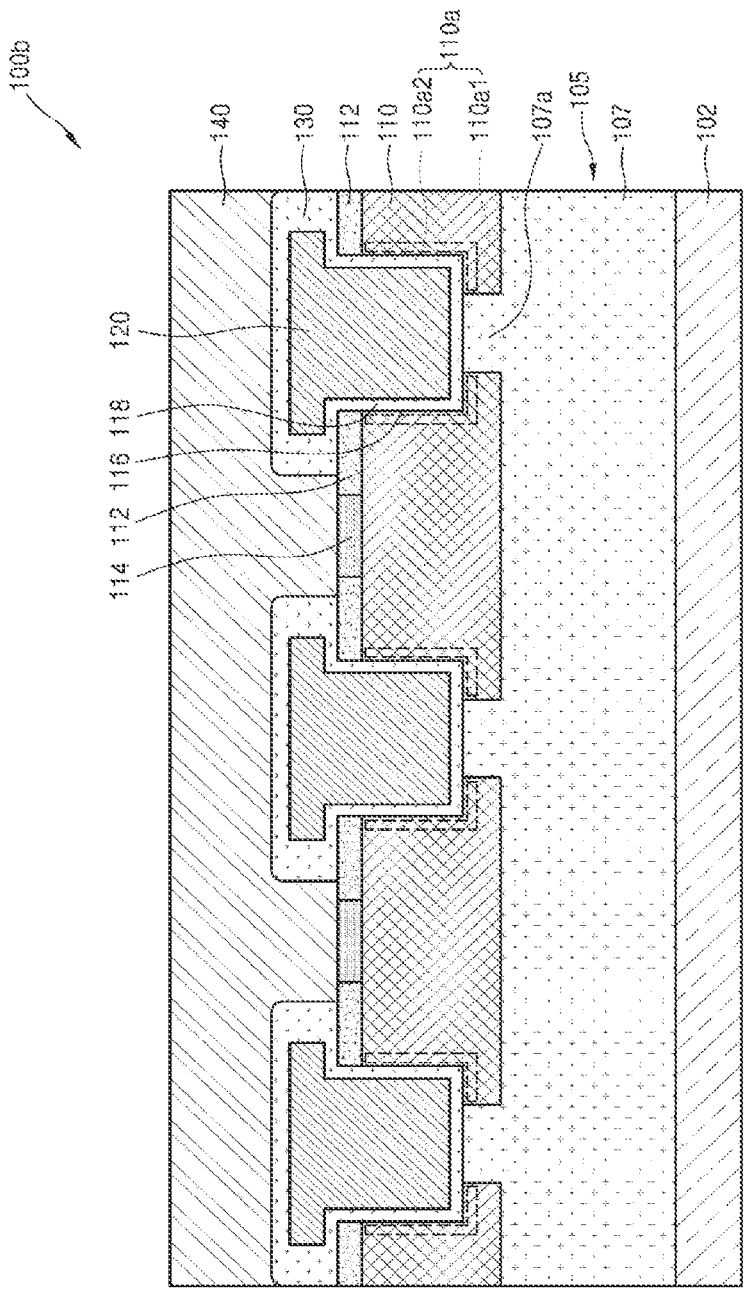
FIG. 7 is a schematic cross-sectional view illustrating a power semiconductor device, according to an embodiment.

FIG. 7 is a schematic cross-sectional view illustrating a power semiconductor device 100b, according to another embodiment. The power semiconductor device 100b according to this embodiment may be implemented by using or partially modifying the power semiconductor device 100 of FIG. 1 or the power semiconductor device 100a of FIG. 6, and thus, overlapping description will be omitted to avoid redundancy.

Referring to FIG. 7, in the power semiconductor device 100b, a plurality of trenches 116 may be arranged parallel to each other in the shape of lines extending in one direction.

Gate insulating layers 118 may be formed on inner surfaces of the trenches 116. A plurality of gate electrode layers 120 may be formed on the gate insulating layers 118 so as to bury the trenches 116, respectively. As such, the gate electrode layers 120 may be formed in the semiconductor layer 105 in a trench type and may be arranged to extend in parallel in the one direction like the trenches 116.

The well region 110 may be formed in the semiconductor layer 105 between the trenches 116 so as to cover the opposite side surfaces 116b of each of the trenches 116. In addition, the well region 110 may extend under bottom surfaces 116b of the trench 116 so as to cover the opposite bottom edges 116c of each of the trenches 116. The well region 110 may expose at least a central part of the bottom surface 116a of each trench 116, and protrusions 107a of the drift region 107 may be formed adjacent to the well region 110 at the exposed parts.

In some embodiments, the remaining part of the drift region 107 except for the protrusions 107a may be interposed between the drain region 102 and the well region 110, and may extend across the trenches 116 or the gate electrode layers 120.

In the power semiconductor device 100b, the gate electrode layers 120 in the trenches 116 may be densely arranged in parallel in a stripe type structure or a line type structure.

As a non-limiting example, a method of fabricating of the power semiconductor device 100b may correspond to the method of fabricating the power semiconductor device 100 described with reference to FIGS. 2 to 5, for example.

According to the power semiconductor device 100b, like the power semiconductor device 100, the concentration of an electric field on the bottom edges of the gate electrode layers 120 or the bottom edges 116c of the trenches 116 may be further alleviated. As such, a margin of an electric field across the gate insulating layer 118 of the power semiconductor device 100b may increase, and thus, the reliability of operation of the power semiconductor device 100b may be improved.

Figure 8:
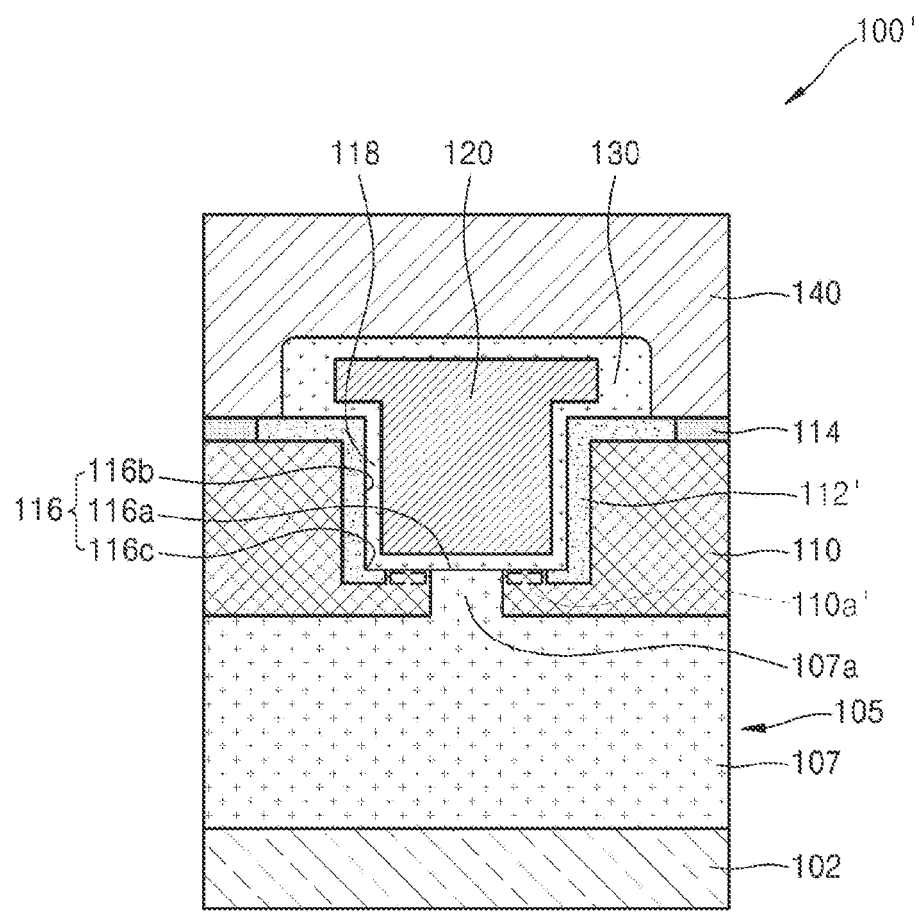
FIG. 8 is a schematic cross-sectional view illustrating a power semiconductor device, according to an embodiment.

FIG. 8 is a schematic cross-sectional view illustrating a power semiconductor device 100', according to an embodiment.

Referring to FIG. 8, the power semiconductor device 100' may at least include the semiconductor layer 105, the gate insulating layer 118, and the gate electrode layer 120. For example, the power semiconductor device 100' may have a power MOSFET structure.

The semiconductor layer 105 may include one semiconductor material layer or a plurality of semiconductor material layers, or may include one epitaxial layer or a plurality of epitaxial layers. In addition, the semiconductor layer 105 include one or multiple epitaxial layers on a semiconductor substrate.

For example, the semiconductor layer 105 may be formed of silicon carbide (SiC). For example, the semiconductor layer 105 may include at least one epitaxial layer of silicon carbide.

Silicon carbide (SiC) may have a wider bandbap than silicon, thus maintaining stability even at a high temperature compared to silicon. In addition, because a breakdown electric field of silicon carbide is much higher than that of silicon, the silicon carbide may stably operate even at a high temperature. Accordingly, the power semiconductor device 100' in which silicon carbide is used as the semiconductor layer 105 may have a high breakdown voltage compared to a power semiconductor device including silicon and may provide an excellent heat release characteristic and a stable operating characteristic at a high temperature.

In more detail, the semiconductor layer 105 may include the drift region 107. The drift region 107 may have the first conductivity type and may be formed by implanting impurities of the first conductivity type into a part of the semiconductor layer 105. For example, the drift region 107 may be formed by doping impurities of the first conductivity type in an epitaxial layer of silicon carbide. In addition, the drift region 107 may include the protrusion 107a, a part of which extends upwardly.

The well region 110 may be formed in the semiconductor layer 105 to be in contact with the drift region 107 and may have the second conductivity type. For example, the well region 110 may be formed by doping impurities of the second conductivity type opposite to the first conductivity type in the semiconductor layer 105.

For example, the well region 110 may be formed to be in contact with the drift region 107 while surrounding at least a part of the drift region 107. For example, the well region 110 may surround a side surface of the protrusion 107a of the drift region 107 and may be formed on the remaining part of the drift region 107. In an operation of the power semiconductor device 100', the protrusion 107a may provide a vertical movement path of charges.

The well region 110 is illustrated in FIG. 8 includes two well regions spaced apart from each other, and the protrusion 107a is interposed between the two well regions, but the well region 110 may be changed or modified in various ways. For example, the protrusion 107a may have a shape having a side surface surrounded by the well region 110 once.

A source region 112' having the first conductivity type may be formed in the semiconductor layer 105. For example, the source region 112' may be formed on the well region 110 or in the well region 110. For example, the source region 112' may be formed by doping impurities of the first conductivity type in the semiconductor layer 105 or the well region 110. The concentration of the first conductivity-type impurities doped in the source region 112' may be higher than that of the first conductivity-type impurities doped in the drift region 107.

In addition, the drain region 102 may be formed in the semiconductor layer 105 under the drift region 107 and may have the first conductivity type. For example, the drain region 102 may be doped with impurities of a high concentration compared to the drift region 107.

Figure 14:
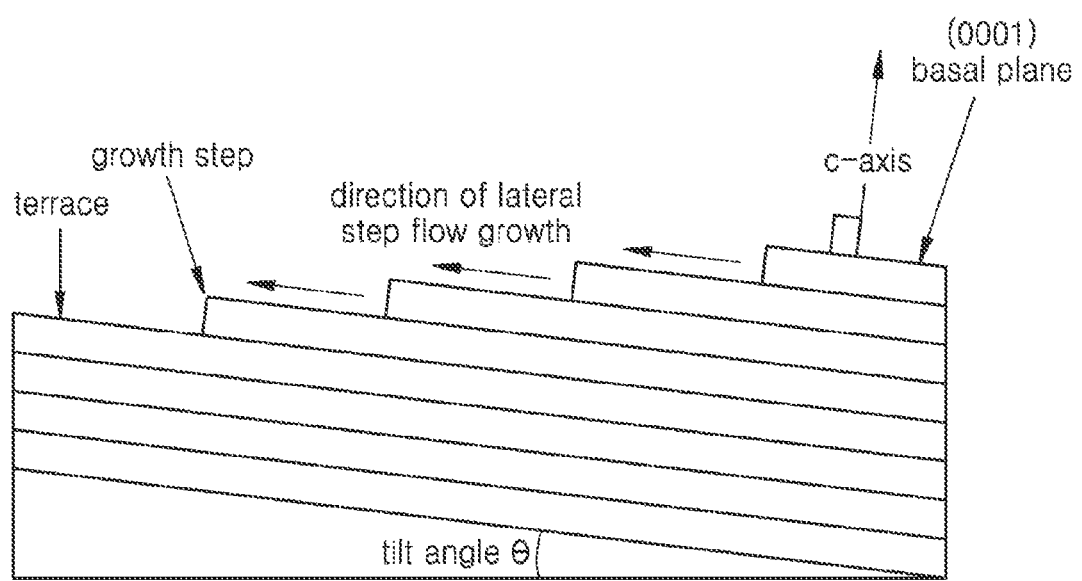
FIG. 14 is a cross-sectional view illustrating formation of an epitaxial layer of silicon carbide.

In some embodiments, the drain region 102 may be implemented with a substrate of silicon carbide having the first conductivity type. In this case, the drain region 102 may be understood as a part of the semiconductor layer 105 or may be understood as a substrate independent of the semiconductor layer 105. In addition, the drift region 107 may be formed of an epitaxial layer on the drain region 102. In this case, the epitaxial layer forming the drift region 107 may be formed on a substrate including the drain region 102 in a state of being tilted at a given angle, as illustrated in FIG. 14.

At least one trench 116 may be formed to be recessed into the semiconductor layer 105 from a surface of the semiconductor layer 105 as much as a given depth. The trench 116 may include the bottom surface 116a, the side surfaces 116b, and the bottom edges 116c. For example, the trench 116 may be formed by etching parts of the well region 110 and the source region 112' from the surface of the semiconductor layer 105 so as to be in contact with the protrusion 107a of the drift region 107. As such, the protrusion 107a of the drift region 107 may be in contact with a part of the bottom surface 116a of the trench 116.

In addition, the well region 110 have a curved shape in which an edge thereof is dug at a part thereof being in contact with the trench 116, and the trench 116 may be seated on the curved portion of the well region 110. As such, the well region 110 may be formed to be in contact with the drift region 107 while surrounding the side surfaces 116b and the bottom edges 116c of the trench 116.

Also, the source region 112' may be formed in the semiconductor layer 105 so as to extend to between the well region 110 and the side surfaces 116b of the trench 116 from the surface of the semiconductor layer 105. For example, the well region 110 and the source region 112' may be formed in the semiconductor layer 105 independently of each other.

For another example, the well region 110 may be first formed, and the source region 112' may then be formed in the well region 110.

In some embodiments, the number of trenches 116 may be appropriately selected depending on the performance of the power semiconductor device 100', for example, one trench 116 or a plurality of trenches 116 may be provided depending on the performance of the power semiconductor device 100; the plurality of trenches 116 may be variously arranged in a line type structure or a matrix structure.

The gate insulating layer 118 may be formed at least on an inner surface of the trench 116. For example, the gate insulating layer 118 may be formed on an inner surface of the trench 116 and on the semiconductor layer 105 outside the trench 116. A thickness of the gate insulating layer 118 may be uniform, or a part of the gate insulating layer 118 formed on the bottom surface of the trench 116 may be thicker than a part of the gate insulating layer 118 formed on a side wall of the trench 116 such that an electric field decreases at a bottom part of the trench 116.

For example, the gate insulating layer 118 may include an insulating material such as silicon oxide, silicon carbide oxide, silicon nitride, hafnium oxide, zirconium oxide, or aluminum oxide, or may include a stacked structure thereof.

At least one gate electrode layer 120 may be formed on the gate insulating layer 118 so as to bury at least the trench 116. For example, the gate electrode layer 120 may include an appropriate conductive material such as polysilicon, metal, metal nitride, or metal silicide, or may include a stacked structure thereof.

In some embodiments, the gate electrode layer 120 may be formed to bury the inside of the trench 116 and to further protrude in an upward direction of the semiconductor layer 105. In addition, the protruding part of the gate electrode layer 120 may further extend onto the well region 110 or the source region 112'. As such, the cross-sectional area of the protruding part of the gate electrode layer 120 may be larger than the cross-sectional area of the part of the gate electrode layer 120, which is buried in the trench 116.

In some embodiments, the well region 110 may be formed in the semiconductor layer 105 to be deeper than the trench 116 while exposing at least a central part of the bottom surface 116a of the trench 116 and surrounding the bottom edges 116c. The protrusion 107a of the drift region 107 may be formed to be in contact with the gate insulating layer 118 and the well region 110 at the central part of the bottom surface 116a of the trench 116, which is exposed by the well region 110.

A channel region 110a' may be formed in the semiconductor layer 105 between the source region 112' and the protrusion 107a of the drift region 107. For example, the channel region 110a' may be formed in the well region 110 to be adjacent to the gate electrode layer 120 continuously from the protrusion 107a of the drift region 107 to the source region 112'.

For example, the source region 112' may be formed to extend along the side surfaces 116b of the trench 116 from the surface of the semiconductor layer 105 and to cover the bottom edge 116c of the trench 116, and the channel region 110a' may be formed under the bottom surface 116a of the trench 116.

In more detail, the well region 110 may be formed to cover an end part of the source region 112' under the bottom surface 116a of the trench 116, and the channel region 110a' may have the second conductivity type such that an inversion channel is formed. In this case, the channel region 110a' may be formed in a horizontal structure in which the channel region 110a' is parallel to a substrate or the drain region 102 along the bottom surface 116a of the trench 116.

Because the channel region 110a' has a doping type opposite to that of the source region 112' and the drift region 107, the channel region 110a' may form a diode junction with the source region 112' and the drift region 107. Accordingly, the channel region 110a' may not permit charges to move in a normal situation (e.g., when no voltage is applied to the gate electrode layer 120); however, when an operating voltage is applied to the gate electrode layer 120, an inversion channel may be formed in the channel region 110a' such that the movement of charges is permitted.

In some embodiments, the channel region 110a' may be a part of the well region 110. In this case, the channel region 110a' may be integrally formed to be continuously connected with the well region 110. A doping concentration of the second conductivity-type impurities of the channel region 110a' may be the same as that of the remaining part of the well region 110 or may be different therefrom for the adjustment of a threshold voltage.

The well contact region 114 may be formed in the source region 112' or on the well region 110. For example, the well contact region 114 may extend from the well region 110 to penetrate the source region 112' and may have the second conductivity type. One well contact region 114 or a plurality of source contact regions 114 may be formed in the source region 112'. To reduce a contact resistance, the well contact region 114 may be doped with second conductivity-type impurities of a higher concentration than that of the well region 110.

The interlayer insulating layer 130 may be formed on the gate electrode layer 120. For example, the interlayer insulating layer 130 may include an appropriate insulating material such as oxide or nitride, or may include a stacked structure thereof.

The source electrode layer 140 may be formed on the interlayer insulating layer 130 and may be connected in common with the source region 112' and the well contact region 114. For example, the source electrode layer 140 may be formed of an appropriate conductive material, such as metal, or the like.

In the power semiconductor device 100' described above, the first conductivity type and the second conductivity type may be opposite to each other, and each of the first conductivity type and the second conductivity type may be one of n-type and p-type. For example, when the first conductivity type is n-type, the second conductivity type is p-type, and vice versa.

For example, when the power semiconductor device 100' is an N-type MOSFET, the drift region 107 may be an N− region, the source region 112' and the drain region 102 may be N+ regions, the well region 110 and the channel region 110a' may be P− regions, and the well contact region 114 may be a P+ region.

In an operation of the power semiconductor device 100', a current may generally flow in a vertical direction along the protrusion 107a of the drift region 107 from the drain region 102, may then flow in a horizontal direction under the bottom surface of the gate electrode layer 120 through the channel region 110a', and may then flow in a vertical direction along the side surface of the gate electrode layer 120 through the source region 112'.

In the power semiconductor device 100', the well region 110 may surround all the bottom edges of the gate electrode layer 120 or all the bottom edges 116c of the trench 116. As such, the concentration of an electric field on the bottom edges of the gate electrode layer 120 or the bottom edges 116c of the trench 116 may be alleviated. In addition, as the source region 112' is extended to the bottom edges 116c of the trench 116, the concentration of an electric field on the bottom edges of the gate electrode layer 120 or the bottom edges 116c of the trench 116 may be further alleviated.

Also, even though orientations of side walls of the trench 116 in epitaxial growth show the deviation, since the source region 112' is formed along the side walls of the trench 116 and the channel region 110a' is formed under the bottom surface 116a of the trench 116, the deviation of mobility of the channel region 110a' does not occur.

As such, a margin of an electric field across the gate insulating layer 118 of the power semiconductor device 100' may increase, and thus, the reliability of operation of the power semiconductor device 100' may be improved. In addition, it is possible to reduce a junction resistance of the protrusion 107a of the drift region 107 by decreasing an electric field of the bottom surface of the trench 116 and decreasing an electric field across the gate insulating layer 118.

Below, a method of fabricating the power semiconductor device 100', according to an embodiment, will be described.

The drift region 107, which includes the protrusion 107a and has the first conductivity type, may be formed in the semiconductor layer 105 of silicon carbide (SiC). For example, the drift region 107 may be formed on the drain region 102 having the first conductivity type. In some embodiments, the drain region 102 may be implemented with a substrate of silicon carbide having the first conductivity type, and the drift region 107 may be formed on the substrate by using one or more epitaxial layers.

Next, the well region 110 having the second conductivity type may be formed in the semiconductor layer 105 to be in contact with the drift region 107. For example, the forming of the well region 110 may include implanting impurities of the second conductivity type into the semiconductor layer 105.

Then, the source region 112' having the first conductivity type may be formed in the well region 110 or on the well region 110. For example, the forming of the source region 112' may include implanting impurities of the first conductivity type into the semiconductor layer 105 on the well region 110 or into the well region 110.

In addition, the well contact region 114 may be formed on the well region 110. For example, the well contact region 114 may be formed by implanting the second conductivity-type impurities of a higher concentration than that of the well region 110 into a part of the semiconductor layer 105 on the well region 110 or into a part of the well region 110.

In addition, the channel region 110a' may be formed in the semiconductor layer 105 between the source region 112' and the protrusion 107a of the drift region 107. For example, the channel region 110a' may be a part of the well region 110 and may be formed by implanting impurities of the second conductivity type into the semiconductor layer 105.

In steps described above, the impurity implantation or the impurity doping may be performed by implanting the impurities into the semiconductor layer 105 or implanting the impurities such that the impurities are mixed when an epitaxial layer is formed. However, an ion implantation method using a mask pattern may be used for implantation of the impurities in a selective region.

Optionally, a heat treatment process for activating or diffusing the impurities may be performed after the ion implantation.

Then, at least one trench 116 may be formed to be recessed into the semiconductor layer 105 from the surface of the semiconductor layer 105 as much as a given depth.

For example, the trench 116 may be formed by partially etching a part of the source region 112' and a part of the well region 110. The bottom surface 116a of the trench 116 may be formed to be in contact with the protrusion 107a of the drift region 107.

For example, the trench 116 may be formed by forming a photo mask by using photo lithography, and then etching the semiconductor layer 105 by using the photo mask as an etching protection layer.

Afterwards, the gate insulating layer 118 may be formed at least on an inner surface of the trench 116. For example, the gate insulating layer 118 may be formed by oxidizing the semiconductor layer 105 to form an oxide or by depositing an insulating material such as oxide or nitride on the semiconductor layer 105.

Afterwards, the gate electrode layers 120 may be formed on the gate insulating layer 118 so as to bury the trench 116. For example, the gate electrode layer 120 may be formed by forming a conductive layer on the gate insulating layer 118 and patterning the conductive layer. The gate electrode layer 120 may be formed by doping impurities in polysilicon, or may be formed to include a conductive metal or metal silicide.

A patterning process may be performed by using photo lithography and etching processes. The photo lithography process may include a process of forming a photoresist pattern as a mask layer by using a photo process and a development process, and the etching process may include a process of selectively etching an underlying structure by using the photoresist pattern.

Afterwards, the interlayer insulating layer 130 may be formed on the gate electrode layer 120. For example, the interlayer insulating layer 130 may be formed by forming at least one insulating layer, for example, an oxide layer on the structure in which the gate electrode layer 120 is formed, and patterning the insulating layer.

Afterwards, the source electrode layer 140 may be formed on the interlayer insulating layer 130 so as to be connected with the source region 112' and the well contact region 114. For example, the source electrode layer 140 may be formed by forming a conductive layer, for example, a metal layer, on the interlayer insulating layer 130 and patterning the conductive layer.

Figure 9:
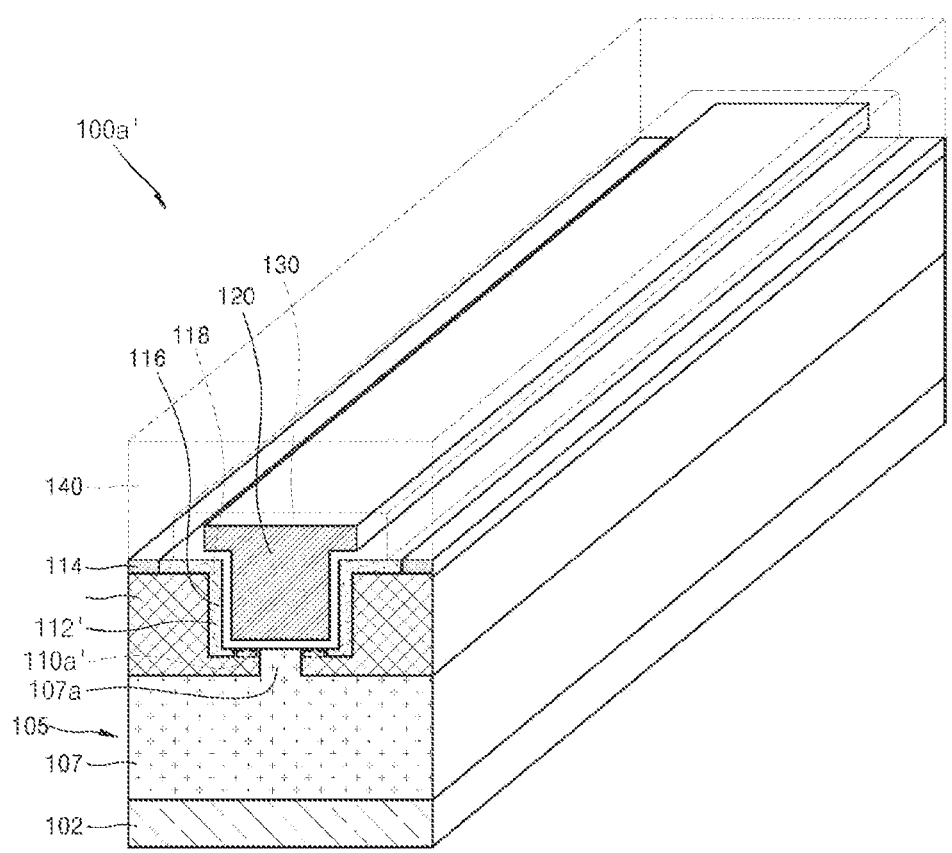
FIGS. 9 and 10 are schematic views illustrating power semiconductor devices, according to embodiments.
Figure 10:
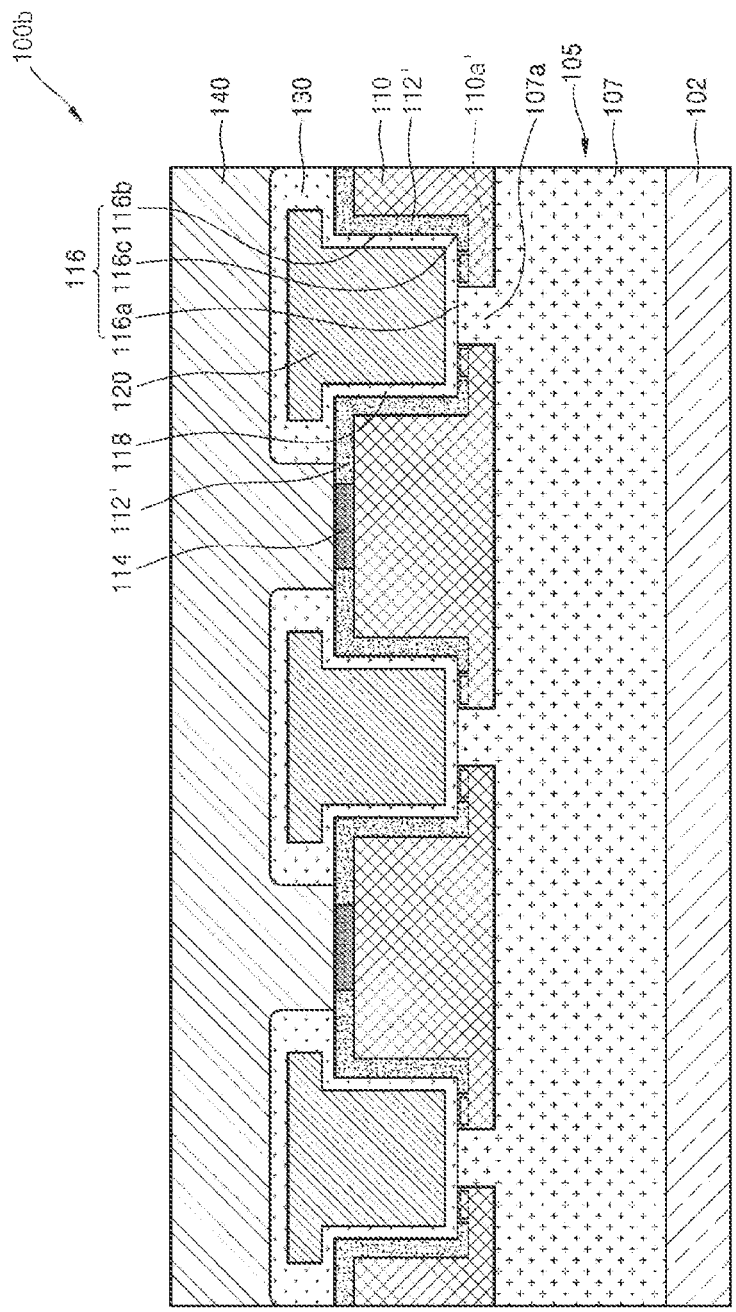

FIGS. 9 and 10 are schematic views illustrating power semiconductor devices 100a' and 100b', according to embodiments. The power semiconductor devices 100a' and 100b' may be implemented by using or partially modifying the power semiconductor device 100' of FIG. 8, and thus, overlapping description will be omitted to avoid redundancy.

Referring to FIG. 9, in the power semiconductor device 100a', the trench 116 may be formed to extend in one direction in a line type structure. As such, the trench 116 may include the side surfaces 116b, which are opposite to each other with respect to one direction, and the bottom edges 116c, which are opposite to each other with respect to the one direction.

The well region 110 may extend under the bottom surface 116a of the trench 116 so as to cover the opposite side surfaces 116b of the trench 116 and cover the opposite bottom edges 116c of the trench 116.

Since the trench 116 is formed in the line type structure, the gate electrode layer 120 may also be formed in the line type structure so as to extend in the one direction. Accordingly, opposite bottom edges of the gate electrode layer 120 may also be covered by the well region 110.

Referring to FIG. 10, in the power semiconductor device 100b', a plurality of trenches 116 may be formed to be arranged parallel to each other in the shape of lines extending in one direction.

The gate insulating layers 118 may be formed on the inner surfaces of the trenches 116. The plurality of gate electrode layers 120 may be formed on the gate insulating layers 118 so as to bury the trenches 116, respectively. As such, the gate electrode layers 120 may be formed in the semiconductor layer 105 in a trench type and may be arranged to extend in parallel in the one direction like the trenches 116.

The well region 110 may be formed in the semiconductor layer 105 between the trenches 116 so as to cover the opposite side surfaces 116b of each of the trenches 116. In addition, the well region 110 may extend under bottom surfaces 116b of the trench 116 so as to cover the opposite bottom edges 116c of each of the trenches 116. The well region 110 may expose at least a central part of the bottom surface 116a of each trench 116, and the protrusions 107a of the drift region 107 may be formed adjacent to the well region 110 at the exposed parts.

In some embodiments, the remaining part of the drift region 107 except for the protrusions 107a may be interposed between the drain region 102 and the well region 110, and may extend across the trenches 116 or the gate electrode layers 120.

In the power semiconductor device 100b', the gate electrode layers 120 in the trenches 116 may be densely arranged in parallel in a stripe type structure or a line type structure.

Figure 11:
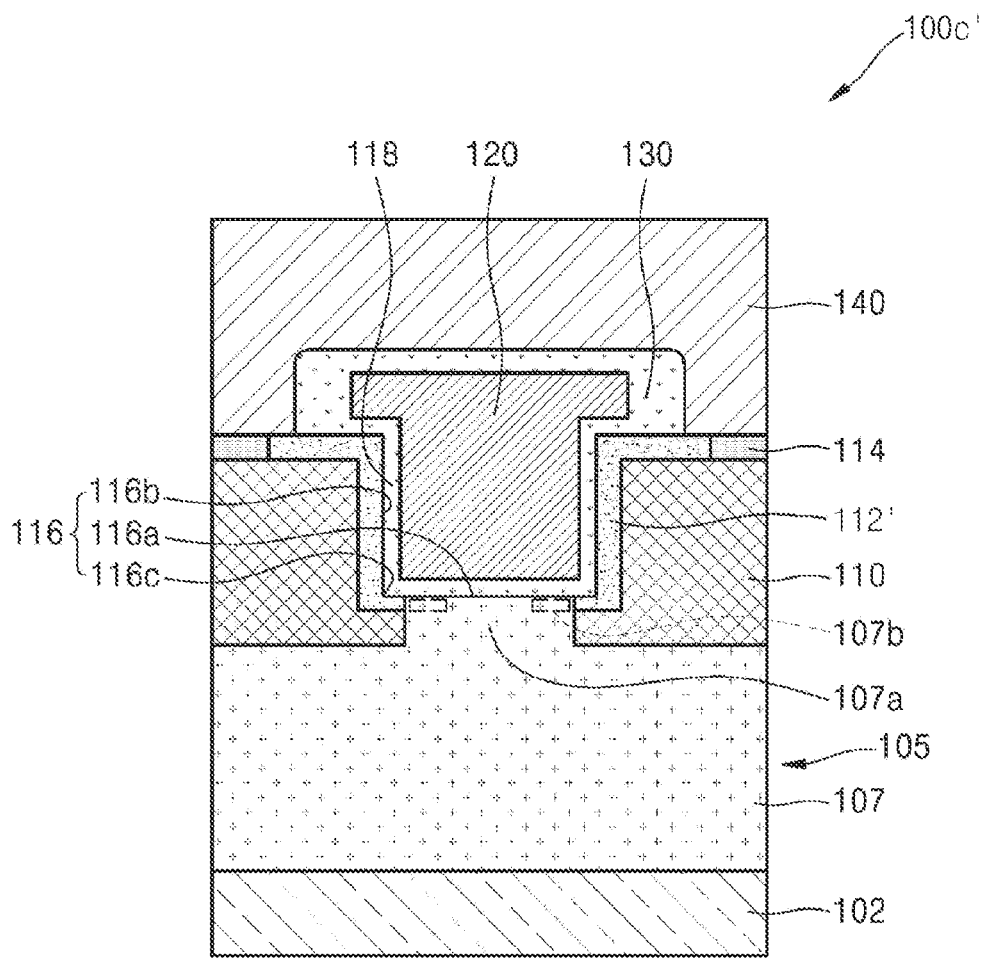
FIGS. 11 to 13 are schematic views illustrating power semiconductor devices, according to embodiments.
Figure 12:
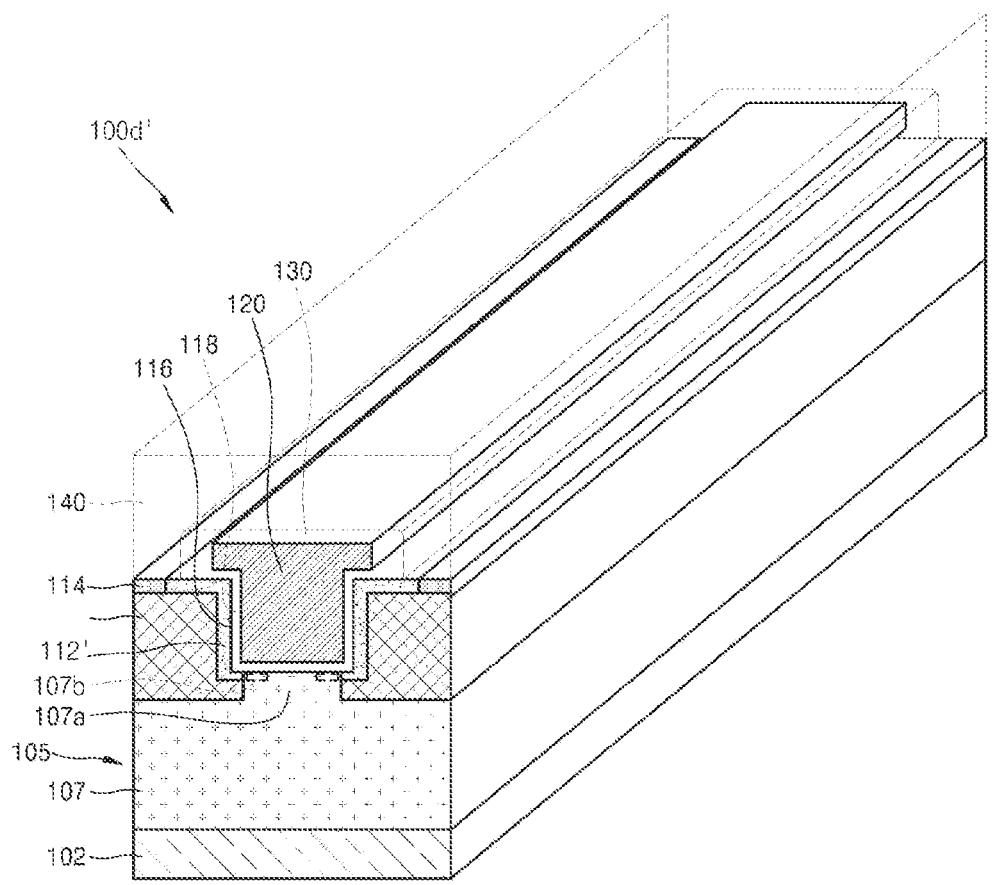
Figure 13:
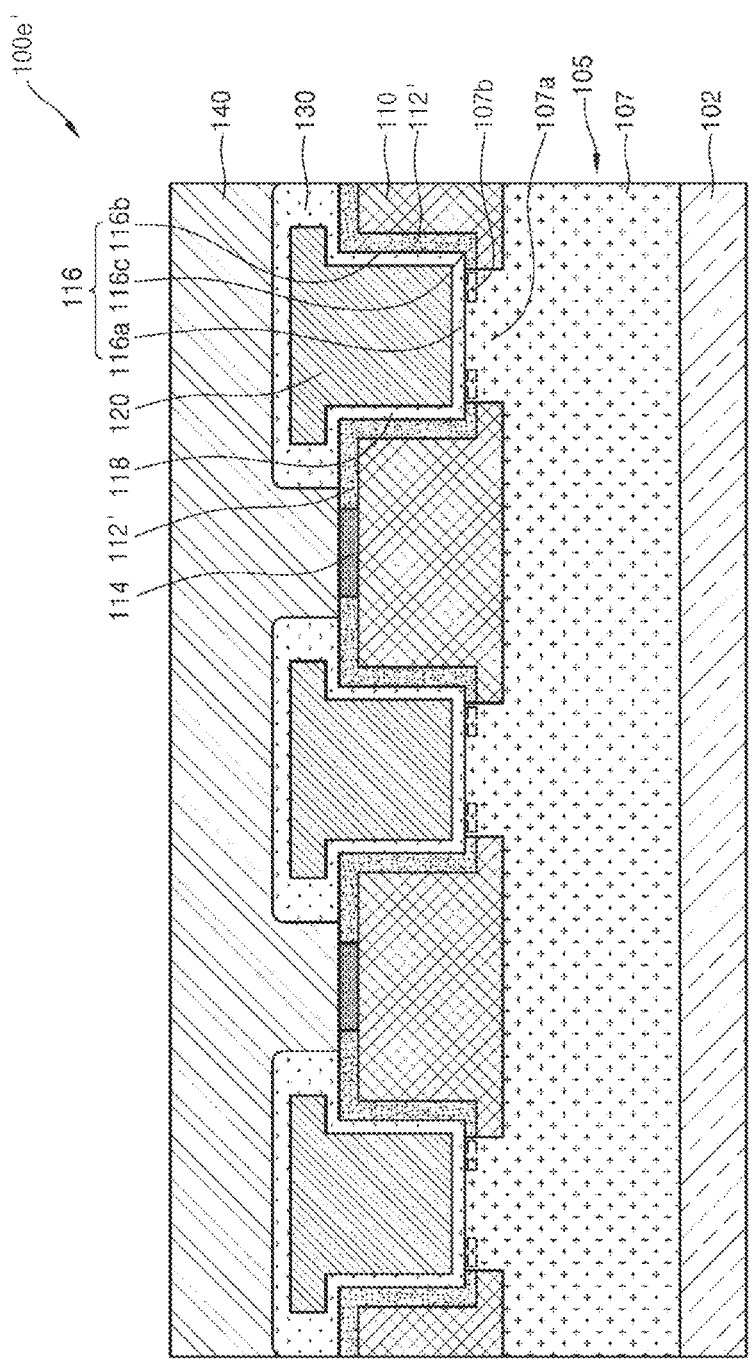

FIGS. 11 to 13 are schematic views illustrating power semiconductor devices 100c', 100d', and 100e', according to embodiments. The power semiconductor device 100c' may be implemented by modifying a partial configuration of the power semiconductor device 100' of FIG. 8, and thus, overlapping description will be omitted to avoid redundancy. The power semiconductor devices 100d' and 100e' may be implemented by adding some components to the power semiconductor device 100' of FIG. 11 or modifying a partial configuration of the power semiconductor device 100' of FIG. 11, and thus, overlapping description will be omitted to avoid redundancy.

Referring to FIG. 11, in the power semiconductor device 100c', the source region 112' may be formed to be in contact with the protrusion 107a of the drift region 107 under the bottom surface 116a of the trench 116. Accordingly, an end part of the source region 112' may be exposed from the well region 110 and may be in contact with the protrusion 107a of the drift region 107.

In addition, a channel region 107b may have the first conductivity type such that an accumulation channel is formed. For example, the channel region 107b may be formed of a part of the protrusion 107a of the drift region 107. The channel region 107b may have the same doping type as the source region 112' and the drift region 107.

In this case, the source region 112', the channel region 107b, and the drift region 107 may be normally electrically connected in structure. However, in the structure of the semiconductor layer 105 of silicon carbide, a potential barrier is formed where a band of the channel region 107b is upwardly bent due to the influence of a negative charge generated by the formation of a carbon cluster in the gate insulating layer 118. As such, the accumulation channel that permits a charge or current flow in the channel region 107b may be formed only when an operating voltage is applied to the gate electrode layer 120.

Accordingly, a threshold voltage to be applied to the gate electrode layer 120 to form the accumulation channel in the channel region 107b may be considerably lower than a threshold voltage to be applied to the gate electrode layer 120 to form the inversion channel of the channel region 110a' of FIGS. 8 to 10.

In some embodiments, the channel region 107b may be integrally formed with the drift region 107. In this case, the drift region 107 may be connected with the source region 112' through the channel region 107b. A doping concentration of the first conductivity-type impurities of the channel region 107b may be the same as that of the remaining part of the drift region 107, or may be different than that of the remaining part of the drift region 107 for the adjustment of a threshold voltage.

Referring to FIG. 12, in the power semiconductor device 100d', the trench 116 may be formed to extend in one direction in a line type. As such, the trench 116 may include the side surfaces 116b, which are opposite to each other with respect to one direction, and the bottom edges 116c, which are opposite to each other with respect to the one direction.

Referring to FIG. 13, in the power semiconductor device 100e', the plurality of trenches 116 may be formed to be arranged parallel to each other in the shape of lines extending in one direction. The plurality of gate electrode layers 120 may be formed on the gate insulating layers 118 so as to bury the trenches 116, respectively. As such, the gate electrode layers 120 may be formed in the semiconductor layer 105 in a trench type structure and may be arranged to extend parallel to each other in the one direction, like the trenches 116.

As described above, according to one or more various embodiments disclosed herein, a power semiconductor device and a method of fabricating the power semiconductor device may allow the concentration of an electric field on a trench edge to be alleviated and a distribution of mobility in a channel region to decrease, thus improving the reliability of the power semiconductor device.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device, comprising:
a semiconductor layer of silicon carbide (SiC);
at least one trench recessed into the semiconductor layer from a surface of the semiconductor layer;
a gate insulating layer disposed on an inner surface of the at least one trench;
at least one gate electrode layer disposed on the gate insulating layer so as to bury the at least one trench;
a drift region disposed in the semiconductor layer under the at least one gate electrode layer, including a protrusion in contact with a part of a bottom surface of the at least one trench, and having a first conductivity type;
a well region disposed in the semiconductor layer such that the well region is in contact with the drift region while surrounding side surfaces and bottom edges of the at least one trench, and having a second conductivity type;
a source region disposed in the well region and having the first conductivity type; and
a channel region disposed in the well region such that the channel region is adjacent to the at least one gate electrode layer continuously from the protrusion to the source region,
wherein channel region is symmetrically formed to cover both bottom edges of the at least one trench.

2. The power semiconductor device of claim 1, wherein the well region is disposed in the semiconductor layer to be deeper than the at least one trench while exposing a central part of the bottom surface of the at least one trench and surrounding the bottom edges, and wherein the protrusion is disposed in contact with the gate insulating layer and the well region at the central part of the bottom surface of the at least one trench.

3. The power semiconductor device of claim 1, wherein the channel region includes:
a horizontal part disposed parallel to the well region under a bottom surface of the at least one gate electrode layer; and
a vertical part disposed perpendicular to the well region on one side surface of the at least one gate electrode layer.

4. The power semiconductor device of claim 1,
wherein the at least one trench extends in one direction in a line type structure,
wherein the at least one trench includes side surfaces that are opposite to each other with respect to the one direction, and bottom edges that are opposite to each other with respect to the one direction, and
wherein the well region extends under the bottom surface of the at least one trench so as to cover the side surfaces of the at least one trench and to cover the bottom edges of the at least one trench.

5. The power semiconductor device of claim 1,
wherein the at least one trench includes a plurality of trenches extending in one direction in a line type structure and arranged in parallel with each other,
wherein the gate insulating layer is disposed at least on inner surfaces of the plurality of trenches, and
wherein the at least one gate electrode layer includes a plurality of gate electrode layers disposed on the gate insulating layer so as to bury the plurality of trenches, respectively.

6. The power semiconductor device of claim 5, wherein the well region is disposed in the semiconductor layer between the plurality of trenches so as to cover opposite side surfaces of each of the plurality of trenches, and extends under bottom surfaces of the plurality of trenches so as to cover opposite bottom edges of each of the plurality of trenches.

7. The power semiconductor device of claim 1, further comprising:
a drain region in the semiconductor layer under the drift region, the drain region having the first conductivity type, wherein a doping concentration of the drain region is higher than a doping concentration of the drift region.

8. The power semiconductor device of claim 7, wherein the drain region is formed of a substrate of silicon carbide having the first conductivity type, and wherein the drift region comprises an epitaxial layer.

9. The power semiconductor device of claim 1, wherein the source region extends to between the well region and the side surfaces of the at least one trench from the surface of the semiconductor layer.

10. The power semiconductor device of claim 9, wherein the well region is disposed in the semiconductor layer to be deeper than the at least one trench while exposing a central part of the bottom surface of the at least one trench and surrounding the bottom edges.

11. The power semiconductor device of claim 9, wherein the source region is formed to extend along the side surfaces of the at least one trench from the surface of the semiconductor layer and to cover the bottom edges of the at least one trench, and wherein the channel region is disposed under the bottom surface of the at least one trench.

12. The power semiconductor device of claim 11, wherein the source region is disposed in contact with the protrusion under the bottom surface of the at least one trench, and wherein the channel region has the first conductivity type such that an accumulation channel is formed, and is a part of the drift region.

13. The power semiconductor device of claim 9, wherein the well region covers an end part of the source region under the bottom surface of the at least one trench, and wherein the channel region has the second conductivity type such that an inversion channel is formed, and is a part of the well region.

14. A method of fabricating a power semiconductor device, the method comprising:
    forming a semiconductor layer of silicon carbide (SIC);
    forming at least one trench recessed into the semiconductor layer from a surface of the semiconductor layer;
    forming a gate insulating layer disposed on an inner surface of the at least one trench;
    forming at least one gate electrode layer disposed on the gate insulating layer so as to bury the at least one trench;
    forming a drift region disposed in the semiconductor layer under the at least one gate electrode layer, including a protrusion in contact with a part of a bottom surface of the at least one trench, and having a first conductivity type;
    forming a well region disposed in the semiconductor layer such that the well region is in contact with the drift region while surrounding side surfaces and bottom edges of the at least one trench, and having a second conductivity type;
    forming a source region disposed in the well region and having the first conductivity type; and
    forming a channel region disposed in the well region such that the channel region is adjacent to the at least one gate electrode layer continuously from the protrusion to the source region,
    wherein channel region is symmetrically formed to cover both bottom edges of the at least one trench.

* * * * *